(12) United States Patent
Shinokawa et al.

(10) Patent No.: US 9,231,038 B2
(45) Date of Patent: Jan. 5, 2016

(54) THIN FILM TRANSISTOR ARRAY AND EL DISPLAY EMPLOYING THEREOF

(71) Applicant: PANASONIC CORPORATION, Osaka (JP)

(72) Inventors: Yasuharu Shinokawa, Hyogo (JP); Ken Ito, Osaka (JP)

(73) Assignee: JOLED INC, Tokyo (JP)

( * ) Notice: Subject to any disclaimer, the term of this patent is extended or adjusted under 35 U.S.C. 154(b) by 0 days.

(21) Appl. No.: 14/284,219

(22) Filed: May 21, 2014

(65) Prior Publication Data

US 2014/0252365 A1  Sep. 11, 2014

Related U.S. Application Data

(63) Continuation of application No. PCT/JP2012/007516, filed on Nov. 22, 2012.

(30) Foreign Application Priority Data

Jan. 17, 2012  (JP) ................................. 2012-006693

(51) Int. Cl.
  *H01L 27/32*  (2006.01)
  *H01L 27/12*  (2006.01)

(52) U.S. Cl.
  CPC .......... *H01L 27/3258* (2013.01); *H01L 27/124* (2013.01); *H01L 27/3248* (2013.01)

(58) Field of Classification Search
  None
  See application file for complete search history.

(56) References Cited

U.S. PATENT DOCUMENTS

2004/0126608 A1  7/2004  Gotoh et al.
2005/0095842 A1 *  5/2005  Ishikawa ........... G02F 1/136227
                                                            438/625
2005/0184395 A1  8/2005  Gotoh et al.
2006/0007366 A1  1/2006  Gotoh et al.
2006/0102907 A1  5/2006  Lee et al.
2006/0154034 A1  7/2006  Araki
2006/0237849 A1  10/2006 Gotoh et al.

(Continued)

FOREIGN PATENT DOCUMENTS

JP  06-236878 A  8/1994
JP  2001-028486 A  1/2001

(Continued)

OTHER PUBLICATIONS

International Search Report issued in International Application No. PCT/JP2012/007516 with Date of mailing Feb. 26, 2013, with English Translation.

*Primary Examiner* — William Coleman
*Assistant Examiner* — Kien Ly
(74) *Attorney, Agent, or Firm* — McDermott Will & Emery LLP

(57) ABSTRACT

EL display has a luminescence unit having a luminescence layer being disposed between a pair of electrodes and a thin film transistor array unit controlling luminescence of the luminescence unit. An interlayer insulation film is disposed between the luminescence unit and the transistor array unit. An anode of the luminescence unit is connected electrically to the thin film transistor array via a contact hole of the interlayer insulation film. The thin film transistor array further has a current supplying relaying electrode that is connected to the anode of the luminescence unit via the contact hole of the interlayer insulation film. A diffusion prevention film is formed on the boundary face of the anode of the luminescence unit and the relaying electrode.

4 Claims, 8 Drawing Sheets

(56) References Cited

U.S. PATENT DOCUMENTS

| | | | |
|---|---|---|---|
| 2007/0075313 A1* | 4/2007 | Kwak | H01L 27/127 257/59 |
| 2009/0218697 A1 | 9/2009 | Gotoh et al. | |
| 2010/0022041 A1 | 1/2010 | Lee et al. | |
| 2010/0090217 A1* | 4/2010 | Akimoto | H01L 29/7869 257/43 |
| 2012/0299031 A1 | 11/2012 | Shiratori | |
| 2013/0056740 A1 | 3/2013 | Lee et al. | |

FOREIGN PATENT DOCUMENTS

| | | |
|---|---|---|
| JP | 2001-160486 A | 6/2001 |
| JP | 2006-023388 A | 1/2006 |
| JP | 2006-049873 A | 2/2006 |
| JP | 2006-148040 A | 6/2006 |
| JP | 2007-264445 A | 10/2007 |
| JP | 2009-229941 A | 10/2009 |
| JP | 2011-209756 A | 10/2011 |
| JP | 2012-252829 A | 12/2012 |

* cited by examiner

THIN FILM TRANSISTOR ARRAY AND EL DISPLAY EMPLOYING THEREOF

RELATED APPLICATIONS

This application is a Continuation of International Application No. PCT/JP2012/007516, filed on Nov. 22, 2012, which in turn claims the benefit of Japanese Application No. 2012-006693, filed on Jan. 17, 2012, the disclosures of which Applications are incorporated by reference herein.

TECHNICAL FIELD

The present disclosure relates to a TFT (Thin Film Transistor) array unit and an OLED (Organic Light Emitting Device) display employing such a TFT array unit.

BACKGROUND

TFTs have been employed in driving circuits of display devices such as OLED displays and LCD displays, and are being developed for improving their characteristics. Emergence of large-sized and high definition displays require these TFTs to have large current driving performance. Recently, TFT made of a crystallized semiconductor film, e.g. polycrystalline silicon or micro crystallite silicon, as an active layer is attracting attention.

As crystallization process for semiconductor films, high temperature process using temperature of 1000 degrees Celsius or more has been established. Recently, low temperature process using temperature of 600 degrees Celsius or less is being developed. The low temperature process can reduce manufacturing cost because this process does not require a use of expensive substrate such as quartz having an excellent heat resistance.

The laser annealing which uses a laser beam for heating attracts attention as one method of the low temperature process. In this method, a laser beam is irradiated on a non single crystal semiconductor film (amorphous silicon or polycrystalline silicon) which is formed on a heat-resistant insulating substrate such as glass substrate, and the semiconductor film is melted as a result. The semiconductor film is then crystallized during a cooling process. Using this crystallized semiconductor film as the active layer (channel domain), TFT is formed integrally. The crystallized semiconductor film has a high mobility carrier, and this improves the performance of TFTs.

As the structure of these TFTs, a bottom-gated structure having a gate electrode disposed under a semiconductor layer is mainly used. Japanese Patent Application Publications JP2001-028486A1 and JP2009-229941A1 describe the examples of such TFTs.

JP2001-028486A1 describes a method of first forming a wiring (electrode) connected to a transistor on a substrate, and then forming a planarized insulation film (an interlayer insulation film) made of photosensitive polyimide by spin coat method so that the film covers the wiring (electrode). Next, a connection hole (contact hole) is formed on the planarized insulation film using lithography method. An organic EL device, which is being connected to the wiring through the connection hole, is then formed on the planarized insulation film.

JP2009-229941A1 describes a protective insulation film layered on a second metal layer (electrode) and a planarized insulation film (an interlayer insulation film) layered on the protective insulation film each having a contact hole for inserting a connecting contact which electrically connects the second metal layer and an anode electrode (lower electrode). The contact hole has a cone-shape that is convexed downward so that the inner surfaces of the protective insulation film and the planarized insulation film are connected without a step.

SUMMARY

An EL display of the present disclosure includes a luminescence unit having a luminescence layer being disposed between a pair of electrodes; a thin film transistor array unit controlling the luminescence of the luminescence unit; an interlayer insulation film disposed between the luminescence unit and the transistor array unit; and a current supplying electrode connected electrically to an electrode of the luminescence unit and for connecting the electrode of the luminescence unit to the thin film transistor array via a contact hole of the interlayer insulation film. Further, a diffusion prevention film is formed on the boundary face of the electrode of the luminescence unit and the current supplying electrode. The diffusion prevention film is made of an oxide having a main component same as the material constituting the electrode of the luminescence unit.

A thin film transistor array unit of the present disclosure, which has an interlayer insulation film disposed between a luminescence unit and has a current supplying electrode connected electrically to an electrode of the luminescence unit via a contact hole of the interlayer insulation film, forms a diffusion prevention film on the boundary face of the electrode of the luminescence unit and the current supplying electrode. The diffusion prevention film is made of an oxide having a main component same as the material constituting the electrode of the luminescence unit.

The foregoing structure allows satisfactory of both electric contact characteristic and reduction of counter diffusion.

DETAILED DESCRIPTION

A TFT array unit and an EL display employing this unit according to one embodiment are described with reference to FIGS. 1 to 8.

Figure 1:
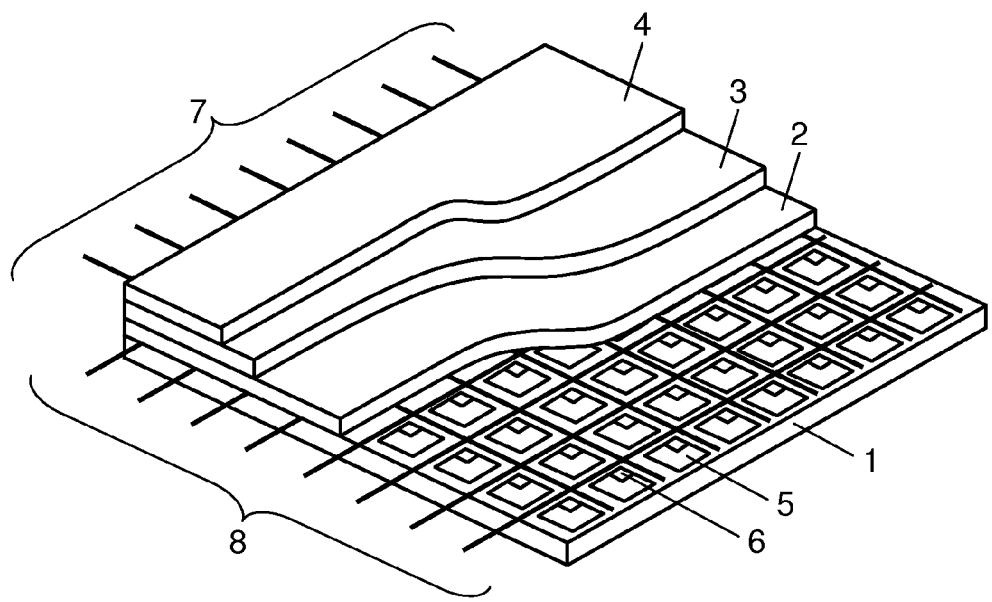
FIG. 1 is a perspective diagram of an EL display according to an exemplary embodiment.
Figure 2:
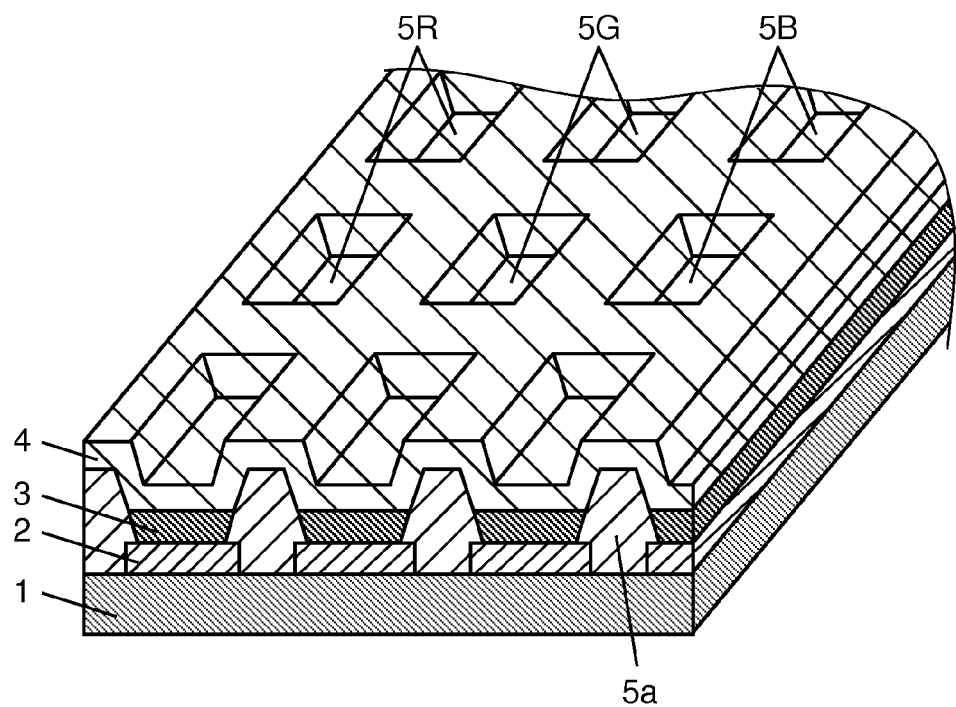
FIG. 2 is a perspective diagram illustrating an example of a pixel bank of the EL display according to the exemplary embodiment.
Figure 3:
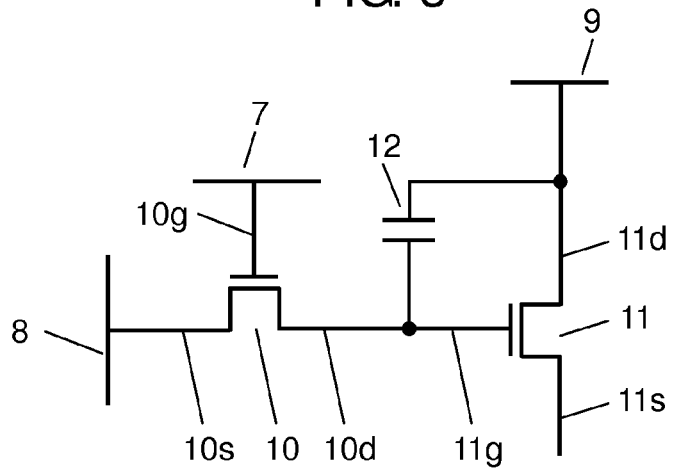
FIG. 3 is an electrical circuit diagram illustrating a circuit structure of a pixel circuit of a TFT according to an exemplary embodiment.

As illustrated in FIGS. 1 to 3, the EL display comprises: TFT array unit 1; anode 2, EL (Electro Luminescence) layer 3, cathode 4 (upper electrode) that are layered in sequence. TFT array unit 1 includes multiple TFTs. Anode 2 is a lower electrode. EL layer 3 is a light emitting layer made of organic material. Cathode 4 is a transparent upper electrode. Anode 2, EL layer 3, and cathode 4 are collectively called "luminescence unit" hereafter. The luminescence unit is controlled by TFT array unit 1.

The luminescence unit has the following structure: EL layer 3 is disposed between a pair of electrodes (the anode 2 and cathode 4); a hole-transport layer is layered between anode 2 and EL layer 3; and an electron-transport layer is layered between EL layer 3 and a transparent cathode 4. TFT array unit 1 has multiple pixels 5 aligned in matrix.

Each of the pixels 5 is controlled by pixel circuit 6 which are provided in each of the pixels 5. TFT array unit 1 has multiple gate wirings 7, source wirings 8, and power supply wirings 9. Gate wirings 7 are aligned in row. Source wirings 8 function as signal lines and are aligned in column so as to intersect gate wirings 7. Although not shown in FIG. 1, power supply wirings 9 extend in parallel to source wirings 8.

Each of pixel circuits 6 has TFT 10 working as a switching device and TFT 11 working as a driving device. One gate wiring 7 is connected to multiple gate electrodes 10g of TFTs 10 that are aligned in a same row. One source wiring 8 is connected to multiple source electrodes 10s of TFTs 10 that are aligned in a same column. One power supply wiring 9 is connected to multiple drain electrodes 11d of TFTs 11 that are aligned in a same column.

As illustrated in FIG. 2, each of pixels 5 of the EL display has sub pixels 5R, 5G, and 5B in three colors (red, green, blue) which are formed on a display surface and are aligned in matrix (sub pixels 5R, 5G, 5B are referred to simply as "sub pixels" hereafter). Each of the sub pixels is separated from each other by bank 5a. Bank 5a is formed by a first group of protrusions parallel to gate wirings 7 and a second group of protrusions parallel to source wirings 8 crossing each other. Each of the sub pixels is formed in an area surrounded by these protrusions, in other words, in an opening of bank 5a.

Anodes 2 are formed on an interlayer insulation film of TFT array unit 1 and in the openings of bank 5a for every sub pixels. EL layers 3 are formed separately on anodes 2 for every sub pixels. The transparent cathode 4 is formed continuously so as to cover bank 5a and to commonly cover all of the sub pixels and EL layers 3 of the EL display.

TFT array unit 1 has pixel circuits 6 that are provided for every sub pixels. Each of the sub pixels and corresponding pixel circuit 6 is electrically connected by a contact hole described later and a relay electrode.

As illustrated in FIG. 3, pixel circuit 6 has TFT 10 working as a switching device, TFT 11 working as a driving device, and capacitor 12 storing data for displaying image.

TFT 10 has gate electrode 10g connected to gate wiring 7; source electrode 10s connected to source wiring 8; drain electrode 10d connected to capacitor 12 and gate electrode 11g of TFT 11; and a semiconductor film (not illustrated). When a voltage is applied to gate wiring 7 and source wiring 8, capacitor 12 is charged with the voltage applied to source wiring 8 as display-data.

TFT 11 has gate electrode 11g connected to drain electrode 10d of TFT 10; drain electrode 11d connected to power supply wiring 9 and capacitor 12; source electrode 11s connected to anode 2; and a semiconductor film (not illustrated). TFT 11 supplies current, which corresponds to amount of voltage stored in capacitor 12, to anode 2 via source electrode 11s using power supply wiring 9. As discussed above, the EL display according to this embodiment employs an active matrix method that controls the display of images for every pixel 5 positioned on the intersections of gate wirings 7 and source wirings 8.

Next, a structure of a pixel constituting TFT array unit 1 is described with reference to FIGS. 4 to 6.

Figure 4:
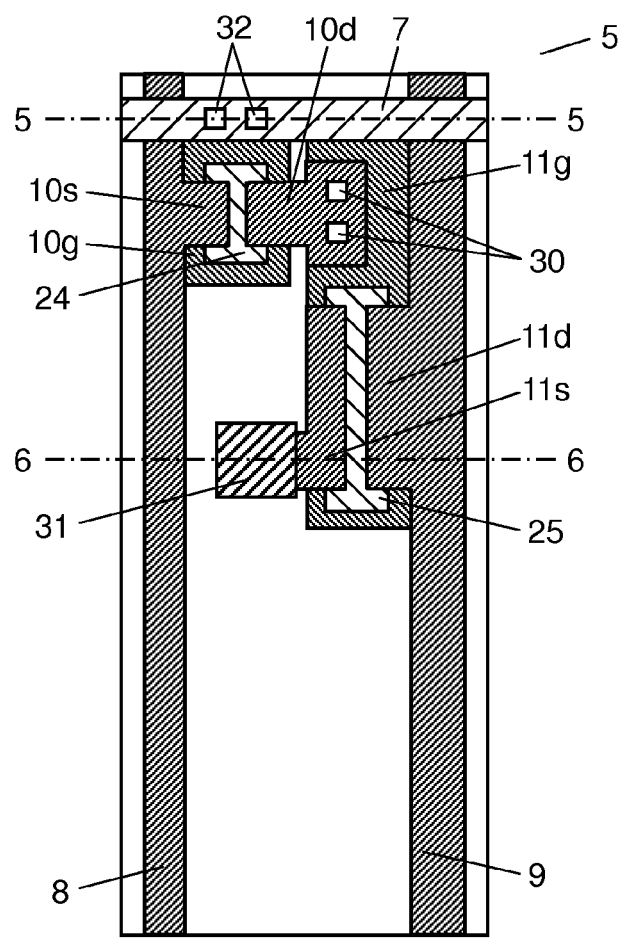
FIG. 4 is a front view illustrating a structure of a pixel of a TFT according to an exemplary embodiment.
Figure 5:
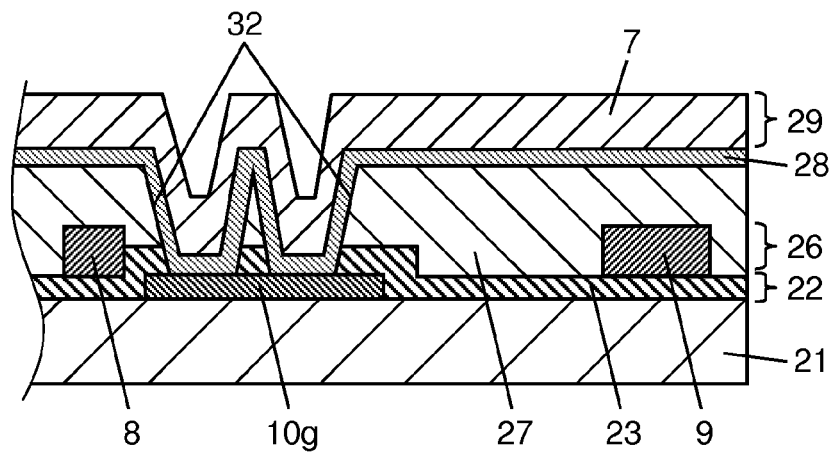
FIG. 5 is a sectional view along 5-5 line of FIG. 4.
Figure 6:
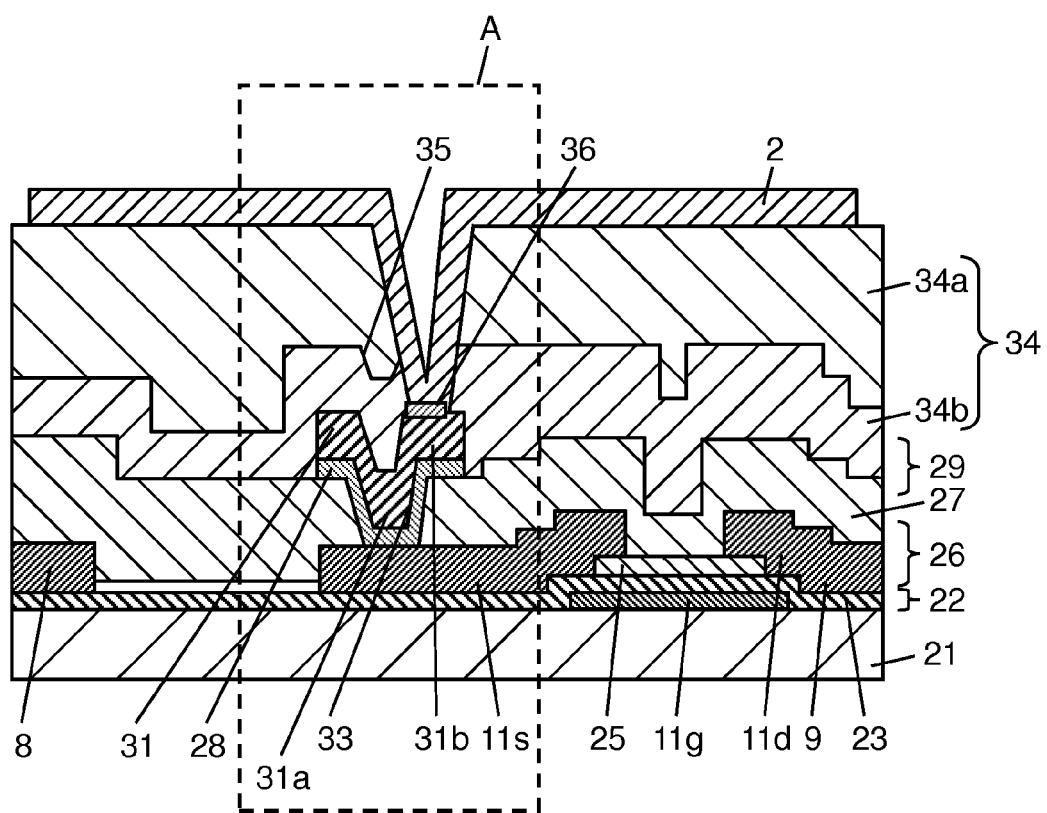
FIG. 6 is a sectional view along 6-6 line of FIG. 4.

As illustrated in FIGS. 4 to 6, pixel 5 is made by a layered structure comprising: substrate 21; first metal layer 22 which is an electric conduction layer; gate insulation film 23; semiconductor films 24 and 25; second metal layer 26 which is an electric conduction layer; passivation film 27; electric conduction oxide film 28 configured by ITO for example; and third metal layer 29 which is an electric conduction layer.

First metal layer 22 is layered on substrate 21. Gate electrode 10g of TFT 10 and gate electrode 11g of TFT 11 are formed in first metal layer 22. As discussed later, the gate electrode 10g of TFT 10 and gate electrode 11g of TFT 11 are formed from the first metal layer 22. Gate insulation film 23 is formed on substrate 21 and first metal layer 22 so as to cover gate electrodes 10g and 11g.

As shown in FIGS. 4-6, semiconductor film 24 is disposed on gate insulation film 23 (between the film 23 and second metal layer 26) and on an area that overlaps with gate electrode 10g. Similarly, semiconductor film 25 is disposed on gate insulation film 23 (between gate insulation film 23 and second metal layer 26) and on an area that overlaps with gate electrode 11g.

As shown in FIGS. 5-6, second metal layer 26 is formed on the films 23, 24 and 25. Source wiring 8; power supply wiring 9; and electrodes of TFT 10 (source electrode 10s, drain electrode 10d), and electrodes of TFT 11 (source electrode 11s, and drain electrode 11d) are formed in second metal layer 26. As discussed later, wiring 8, power supply wiring 9, electrodes of TFT 10 and electrodes of TFT 11 are formed from the metal of the second metal layer 26.

The electrodes 10s and 10d are formed such that each of them overlaps with a portion of semiconductor film 24 at where these electrodes face each other. Source electrode 10s is formed extending from source wiring 8 which is on second metal layer 26.

Similarly, the electrodes 11d and 11s are formed such that each of them overlaps with a portion of semiconductor film 25 at where these electrodes face each other. Drain electrode 11d is formed extending from power supply wiring 9 which is in second metal layer 26.

TFT 10 is a bottom gate type transistor which has gate electrode 10g formed on a lower layer of source electrode 10s and drain electrode 10d. Similarly, TFT 11 is a bottom gate type transistor which has gate electrode 11g formed on an upper layer of source electrode 11s and drain electrode 11d.

Gate insulation film 23 has contact hole 30 penetrating the film 23 in a thickness direction at where the film 23 overlaps with drain electrode 10d and gate electrode 11g. Drain electrode 10d is connected electrically to gate electrode 11g, which is formed on first metal layer 22, via contact hole 30.

As shown in FIGS. 5-6, passivation film 27 is formed on gate insulation film 23 and second metal layer 26 such that passivation film 27 covers the source electrodes 10s, 11s and drain electrodes 10d, 11d. Passivation film 27 is formed between interlayer insulation film 34, TFT 10, and TFT 11.

Electric conduction oxide film 28 is layered on passivation film. Third metal layer 29 is layered on electric conduction oxide film 28. Gate wiring 7 and relaying electrode 31 are formed in third metal layer 29. As discussed later, gate wiring 7 and relaying electrode 31 are formed from the metal of third metal layer 29. Electric conduction oxide film 28 is formed selectively on an area overlapping with gate wiring 7 and relaying electrode 31. The area overlapping with gate wiring 7 and the area overlapping with relaying electrode 31 are not electrically connected.

Gate insulation film 23 and passivation film 27 have a contact hole 32 penetrating the films in a thickness direction at where the films 23 and 27 overlap with gate wiring 7 and gate electrode 10g. Gate wiring 7 is connected electrically to gate electrode 10g formed in first metal layer 22, via the contact hole 32. Gate wiring 7 and gate electrode 10g do not directly contact each other because electric conduction oxide film 28 is intervened between them.

Similarly, passivation film 27 has a contact hole 33 penetrating the film 27 in a thickness direction at where the film 27 overlaps with source electrode 11s of TFT 11 and relay electrode 31. Relay electrode 31 is connected electrically to source electrode 11s formed in second metal layer 26, via the contact hole 33. Source electrode 11s and relay electrode 31 are not directly contacted each other because electric conduction oxide film 28 is formed between them.

Interlayer insulation film 34 is formed on passivation film 27 and third metal layer 29 such that the film 34 covers gate wiring 7 and relay electrode 31. The film 34 has a layered structure and comprises interlayer insulation film 34a working as a planarization film, and interlayer insulation film 34b working as a passivation film. The film 34a is made of organic material film or hybrid film and is formed on the upper side layer which contacts the anode 2. The film 34b is made of inorganic film and is formed on the lower side layer which contacts gate wiring 7 and relay electrode 31.

Bank 5a is formed on interlayer insulation film 34 in a portion that borders with neighboring pixel 5. In the opening of bank 5a, anode 2 and EL layer 3 are formed. One anode 2 is formed for one pixel 5. One EL layer 3 is formed for one color (one sub pixel column) or for one sub pixel. The transparent cathode 4 is formed on EL layers 3 and banks 5a.

As illustrated in FIG. 6, interlayer insulation film 34 has a contact hole 35 penetrating the film 34 at where the film 34 overlaps with anode 2 and relay electrode 31. Anode 2 is connected electrically to relay electrode 31 formed in third metal layer 29, via the contact hole 35. Relay electrode 31 comprises: center area 31a that fills in contact hole 33, and flat area 31b which extends at the upper portion of the contact hole 33. Anode 2 is connected electrically on flat area 31b of relay electrode 31.

In the present disclosure, anode 2 of the luminescence unit is made of a conductive metal material comprising essentially aluminum. Relay electrode 31 for supplying current to TFT array unit 1 is made of conductive metal material including Cu (copper) which is different from the material of anode 2. On the boundary face of anode 2 and relay electrode 31, diffusion-prevention film 36 is formed. Diffusion-prevention film 36 is made of metal oxide comprising essentially aluminum, which is the same material with anode 2 of the luminescence unit. Material composition of diffusion-prevention film 36 is AlxCuyOz, which satisfies x>y≥0, and z>0, when measured by Energy Dispersive X-ray Spectrometer (EDS), for example.

Table 1 shows characteristics of above mentioned diffusion-prevention film 36, which is formed between an aluminum-based anode 2 and a copper-based relay electrode 31. Here, four kinds of samples having different film thickness of diffusion-prevention film 36, i.e. Examples 1 to 4 of the present disclosure, and comparative samples (Comparative Examples 1 to 3) are prepared. Then the amount of contact defect and counter diffusion between anode 2 and relay electrode 31 are compared for each of the samples.

Regarding to contact defect, samples having connection resistance less than 1 kilo-omega per unit area are indicated as non-defective samples (letter "o") and samples having connection resistance equal to or more than 1 kilo-omega per unit area are indicated as defective samples (letter "x") in Table 1. Regarding to counter diffusion amount, inventors have confirmed from an experiment that when this amount is less than 100 nano-meters, counter diffusion of aluminum and copper hardly causes electro-migration and disconnection. Accordingly, the samples having the amount less than 100 nano-meters are indicated as non-defective samples (letter "o") and the samples having the amount equal to or more than 100 nano-meters are indicated as defective samples (letter "x").

TABLE 1

|  | Film Thickness (nm) | Contact Defect | Counter Diffusion Amount |
| --- | --- | --- | --- |
| Example 1 | 1 | O | O |
| Example 2 | 2 | O | O |
| Example 3 | 4 | O | O |
| Example 4 | 6 | O | O |

TABLE 1-continued

|  | Film Thickess (nm) | Contact Defect | Counter Diffusion Amount |
|---|---|---|---|
| Comparative Example 1 | 8 | X | O |
| Comparative Example 2 | 9 | X | O |
| Comparative Example 3 | 10 | X | O |

According to the result shown in Table 1, non-defective sample, having small contact defect and counter diffusion, can be obtained when film thickness t of the diffusion-prevention film 36 is between 1 to 6 nano-meters. Film thickness t of diffusion-prevention film 36 can be preferably $0 < t \le 6$ nano-meters, because contact resistance can be made lower when film thickness t of diffusion-prevention film 36 is smaller, and thus have an advantageous electrical property. However, the counter diffusion of aluminum and copper may likely to occur due to thermal-history during a manufacturing process after the formation of diffusion-prevention film 36. Considering the variation in the manufacturing process, thickness of diffusion-prevention film 36 is desirably between 1 to 6 nano-meters.

Diffusion-prevention film 36 having thin film thickness can be fabricated by first forming contact hole 35 by dry etching, and then forming anode 2 using sputtering method in a vacuum continuously without being exposing to the room air. The film thickness of diffusion-prevention film 36 can be controlled by adjusting the film thickness of a copper-based oxide film before forming anode 2. The film thickness of the oxide film can be controlled first by forming an oxide film, and then by removing the oxide film physically using Ar (argon) plasma or reduction process using H2 plasma, for example.

As discussed above, the present disclosure relates to diffusion-prevention film 36 made of aluminum-based oxide. The film 36 is formed between anode 2 made of aluminum-based conductive material and relay electrode 31 made of conductive material including copper which is a material different from that of anode 2. The electro-migration oriented disconnection due to counter diffusion of aluminum and copper can thereby be prevented. Further, a sufficient contact characteristic can be acquired by adjusting the film thickness of diffusion-prevention film 36 between 1 to 6 nano-meters, and disconnection due to counter diffusion is also prevented.

Next, manufacturing process of TFT array unit 1 according to an exemplary embodiment is discussed with reference to FIGS. 7A to 7F, and FIGS. 8A to 8H.

Figure 7A:
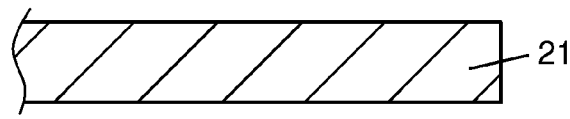
FIG. 7A is a sectional view illustrating a manufacturing process of a portion of the TFT array unit shown in FIG. 5 according to an exemplary embodiment.
Figure 8A:
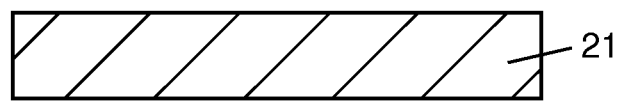
FIG. 8A is a sectional view illustrating a manufacturing process of a portion of the TFT array unit shown in FIG. 6 according to an exemplary embodiment.

Substrate 21 is prepared first as shown in FIGS. 7A and 8A. Generally, an insulating material, such as glass and quartz are used for substrate 21. An oxidization silicon film or a silicon nitride film can be formed on the upper surface of substrate 21 to prevent impurity diffusion from substrate 21. The film thickness is about 100 nm.

Figure 7B:
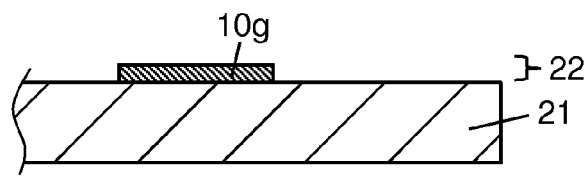
FIG. 7B is a sectional view illustrating a manufacturing process of a portion of the TFT array unit shown in FIG. 5 according to the exemplary embodiment.
Figure 8B:
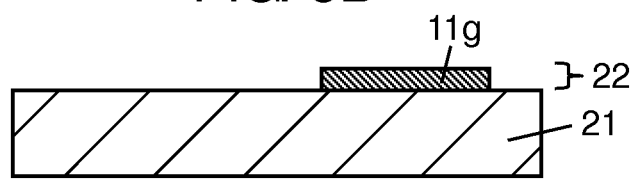
FIG. 8B is a sectional view illustrating a manufacturing process of a portion of the TFT array unit shown in FIG. 6 according to the exemplary embodiment.

Next, as shown in FIGS. 7B and 8B, first metal layer 22 having heat resistance is formed on substrate 21. Gate electrodes 10g and 11g are then formed by patterning using photo-lithographic method or etching method etc. The electrodes can be made of a heat resistant material such as Mo (molybdenum), W (tungsten), Ta (tantalum), Ti (titanium), and Ni (nickel); or alloy thereof. In the present example, Mo is used. Desirably, the thickness is 100 nano-meters.

Figure 7C:
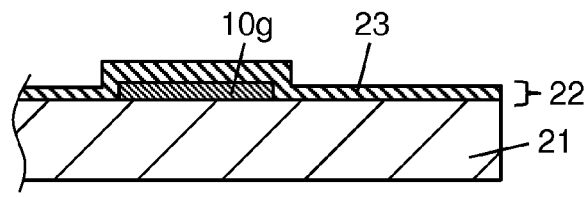
FIG. 7C is a sectional view illustrating a manufacturing process of a portion of the TFT array unit shown in FIG. 5 according to the exemplary embodiment.
Figure 8C:
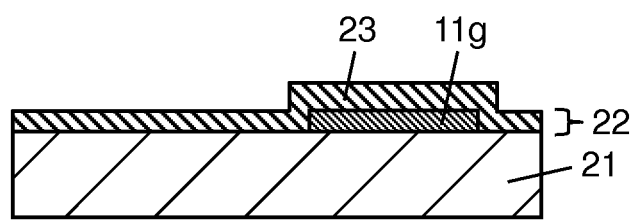
FIG. 8C is a sectional view illustrating a manufacturing process of a portion of the TFT array unit shown in FIG. 6 according to the exemplary embodiment.

Next, as shown in FIGS. 7C and 8C, gate insulation film 23 is formed on substrate 21 and first metal layer 22. Then, semiconductor layers 24 and 25 are formed on gate insulation film 23. Gate insulation film 23 and semiconductor layers 24 and 25 are formed continuously in a vacuum state using plasma CVD method etc. Gate insulation film 23 is made of an oxidization silicon film, a silicon nitride film, or composite membrane thereof. Thickness is about 200 nano-meters. Semiconductor layers 24 and 25 are made of amorphous silicon films with thickness of about 50 nano-meters.

Figure 8D:
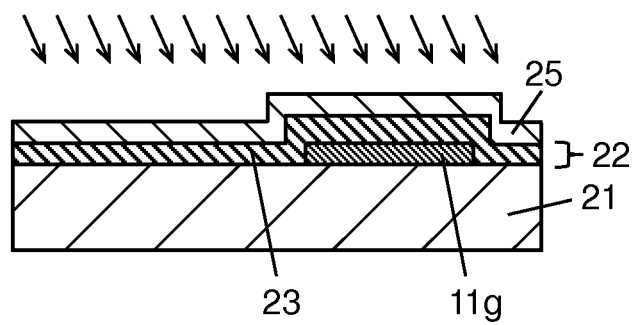
FIG. 8D is a sectional view illustrating a manufacturing process of a portion of the TFT array unit shown in FIG. 6 according to the exemplary embodiment.

Then, an excimer-laser is irradiated on semiconductor layer 25 as illustrated in arrows of FIG. 8D, to change the property of semiconductor layer 25 from a non-crystalline semiconductor layer to a multi-crystalline semiconductor layer. The crystallization here can be achieved by first dehydrate in an oven of temperature between 400 Celsius and 500 Celsius, then crystallize using an excimer laser, and perform hydrogen plasma processing thereafter in a vacuum for several seconds to several tens of seconds. Specifically, temperature of the non-crystalline semiconductor layer is raised to a predetermined temperature range by irradiating with the excimer laser. Here, the predetermined temperature range is 210 to 1414 Celsius, for example. The average diameter of crystal grain of the multi-crystalline semiconductor layer is between 20 to 60 nano-meters.

First metal layer 22, which constitutes gate electrodes 10g and 11g, needs to be formed by a metal having melting temperature higher than the upper limit of the temperature range (i.e. 1414 Celsius) because the layer 22 is exposed to a high temperature in the above-mentioned process. On the contrary, second metal layer 26 and third metal layer 29, which will be layered in the subsequent processes, can be formed of metal having a melting temperature lower than the lower limit of the temperature range (i.e. 210 Celsius).

Figure 8E:
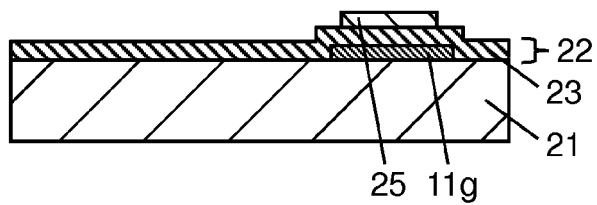
FIG. 8E is a sectional view illustrating a manufacturing process of a portion of the TFT array unit shown in FIG. 6 according to the exemplary embodiment.

Next, as illustrated in FIG. 8E, semiconductor layer 25 is formed into an island-like semiconductor layer using photo-lithographic method or etching method etc. The contact hole 30 is also formed in gate insulation film 23 by the photo-lithographic method or etching method etc.

Figure 7D:
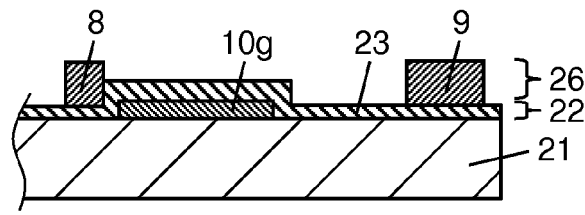
FIG. 7D is a sectional view illustrating a manufacturing process of a portion of the TFT array unit shown in FIG. 5 according to the exemplary embodiment.
Figure 8F:
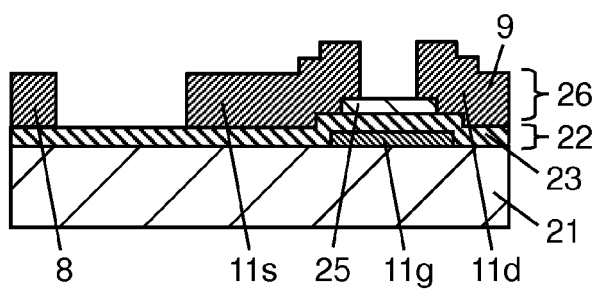
FIG. 8F is a sectional view illustrating a manufacturing process of a portion of the TFT array unit shown in FIG. 6 according to the exemplary embodiment.

Thereafter, as illustrated in FIGS. 7D and 8F, second metal layer 26 is formed on gate insulation film 23, semiconductor layer 24 (not illustrated in FIGS. 7D or 8F) and semiconductor layer 25. Source wiring 8, power supply wiring 9, source electrodes 10s and 11s, drain electrodes 10d and 11d, and relay electrode 31 is then fabricated respectively by patterning. At this point, material constituting second metal layer 26 is also filled in contact hole 30 to form metal filled contact hole 30. By this process, gate electrode 11g and drain electrode 10d are electrically connected via contact hole 30 as shown in FIG. 4. Second metal layer 26 can be made of low resistance metals such as Al (aluminum), Cu (copper), and Ag (silver) or an alloy thereof. In this embodiment, Cu is used and the thickness is about 300 nano-meters.

Generally, a semiconductor layer of low resistance is formed between source electrode 10s and semiconductor layer 24 and also between drain electrode 10d and semiconductor layer 24. This low resistance semiconductor layer is generally made of an amorphous silicon layer to which n-type dopant such as phosphorus is doped, and of an amorphous silicon layer to which p-type dopant such as boron is doped. The thickness is about 20 nano-meters. An amorphous silicon layer can be further formed between the crystallized semiconductor layer 24 and the doped amorphous silicon layer. These films may be necessary for improving the device property. The similar structure can be applied to semiconductor layer 25.

Figure 7E:
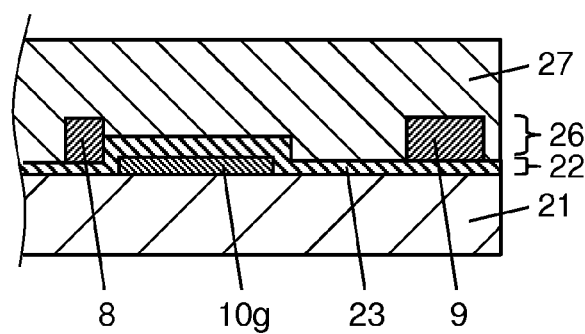
FIG. 7E is a sectional view illustrating a manufacturing process of a portion of the TFT array unit shown in FIG. 5 according to the exemplary embodiment.
Figure 7F:
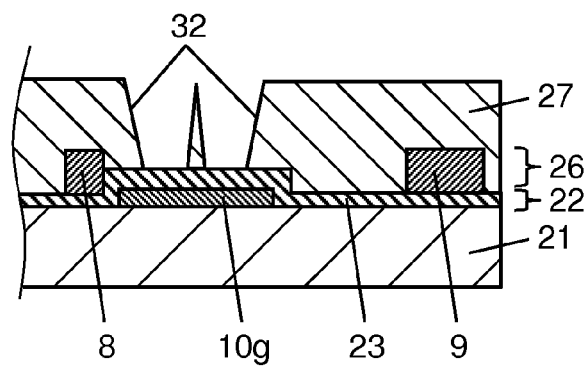
FIG. 7F is a sectional view illustrating a manufacturing process of a portion of the TFT array unit shown in FIG. 5 according to the exemplary embodiment.
Figure 8G:
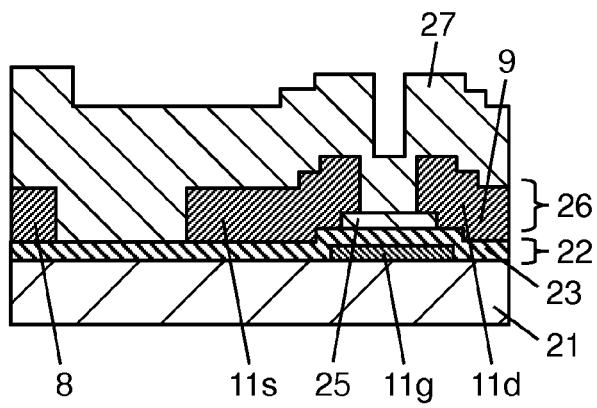
FIG. 8G is a sectional view illustrating a manufacturing process of a portion of the TFT array unit shown in FIG. 6 according to the exemplary embodiment.

Then as shown in FIGS. 7E, 7F, and 8G, passivation film 27 is formed on gate insulation film 23, semiconductor layer 24 (not illustrated), semiconductor layer 25, and second metal layer 26. Passivation film 27 can be made of an oxidization silicon film, a silicon nitride film, or layered films thereof. Using photo-lithographic method or etching method, contact hole 32 that penetrates gate insulation film 23 and passivation film 27 continuously, and contact hole 33 that penetrates passivation film 27 in the thickness direction are formed in passivation film 27.

The material and film thickness of gate insulation film 23 which is inserted between first metal layer 22 and second metal layer 26, and passivation film 27 which is inserted between second metal layer 26 and third metal layer 29 are determined such that the capacity per unit area of passivation film 27 becomes larger than that of gate insulation film 23. The capacity per unit area of passivation film 27 is preferably less than $1.5*10^{-4}$ (F/m$^2$). The capacity per unit area of gate insulation film 23 is preferably equal to or more than $1.5*10^{-4}$ (F/m$^2$).

Figure 8H:
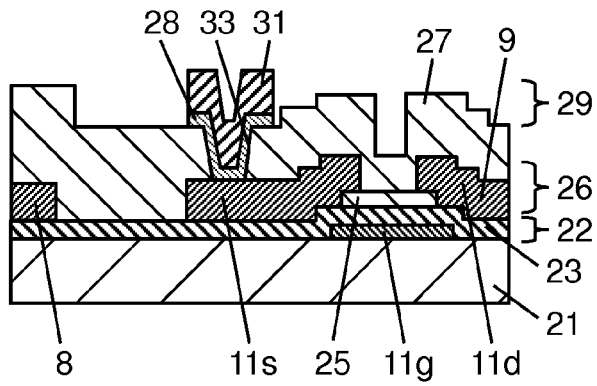
FIG. 8H is a sectional view illustrating a manufacturing process of a portion of the TFT array unit shown in FIG. 6 according to the exemplary embodiment.

Then, as illustrated in FIGS. 6 and 8H, electric conduction oxide film 28 is formed on passivation film 27 and third metal layer 29 is formed on electric conduction oxide film 28. Third metal layer 29 is fabricated into gate wiring 7 and relay electrode 31 by patterning. Electric conduction oxide film 28 can be made of an oxide film including indium and tin or of an oxide film including indium and zinc. Third metal layer 29 can be made of a material having low resistance, for example the material same as second metal layer 26. In the present disclosure, a material including copper (Cu) is desirable. Thickness is about 300 nm.

At this point, metal filled contact holes 32 and 33 are formed by filling a material constituting electric conduction oxide film 28 and third metal layer 29 in the contact holes 32 and 33. Gate wiring 7 and gate electrode 10g are thereby connected electrically via the contact hole 32. Source electrode 11s and relay electrode 31 are connected electrically via the contact hole 33.

Next, forming process of area A of FIG. 6 is detailed with reference to FIGS. 9A to 9G. Specifically, fabrication of connection unit of relay electrode 31 and anode 2 using self-alignment is discussed.

Figure 9A:
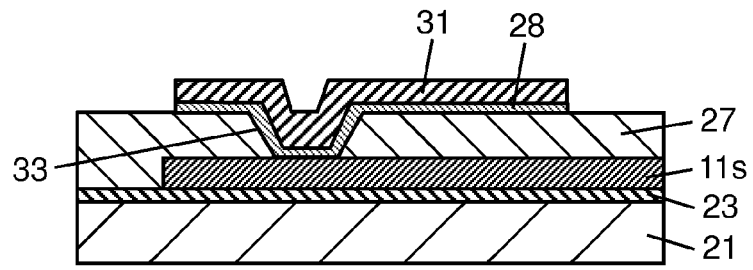
FIG. 9A is a sectional view illustrating a manufacturing process of a portion corresponding to the area A of FIG. 6.

First, the structure illustrated in FIG. 9A is formed through manufacturing processes of FIGS. 8A to 8H discussed above.

Figure 9B:
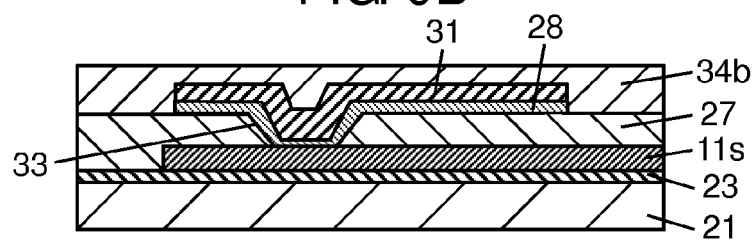
FIG. 9B is a sectional view illustrating a manufacturing process of the portion corresponding to the area A of FIG. 6.

As illustrated in FIG. 9B, interlayer insulation film 34b is formed on passivation film 27 and relay electrode 31. Interlayer insulation film 34b is formed using plasma CVD method etc. Interlayer insulation film 34b can be made of an oxidization silicon film, a silicon nitride film, or composite films thereof. The thickness of the film 34b is about 200 nano-meters and this film functions as a passivation film.

Figure 9C:
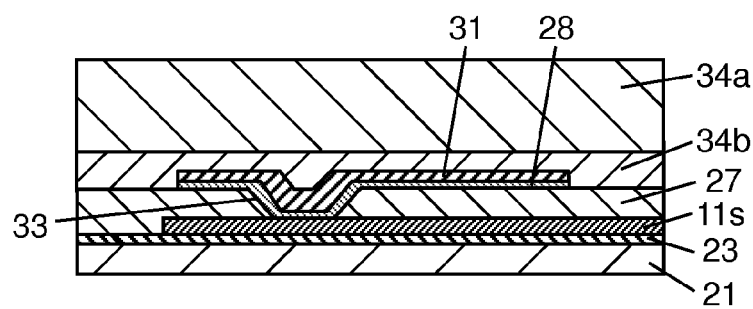
FIG. 9C is a sectional view illustrating a manufacturing process of the portion corresponding to the area A of FIG. 6.

Next, as illustrated in FIG. 9C, interlayer insulation film 34a is formed on interlayer insulation film 34b. Interlayer insulation film 34a functions as planarizing film and preferably made of coating material which can have a substantial thickness, such as spin coater and slit coater. Interlayer insulation film 34a is preferably a photosensitive material, and can be made of an organic material such as acrylic resin and polyimide resin, or hybrid materials such as SOG (Spin-On Glass) material having Si—O connection. Thickness of the film 34a is about 4000 nano-meters.

Figure 9D:
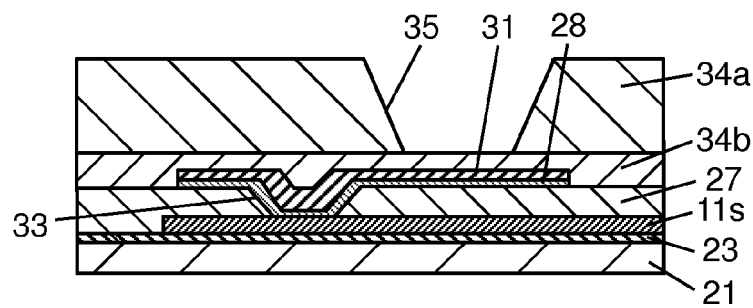
FIG. 9D is a sectional view illustrating a manufacturing process of the portion corresponding to the area A of FIG. 6.

Next, as illustrated in FIG. 9D, interlayer insulation film 34a, which is a photosensitive material, is fabricated using photo-lithographic method to form a contact hole 35 that penetrates interlayer insulation film 34a. Interlayer insulation film 34a made of coated material is cured by baking at about 230 Celsius. Interlayer insulation film 34b made of an inorganic film prevents relay electrode 31 from corrosion due to a gas, such as moisture generated from interlayer insulation film 34a during the baking of the film 34a.

Next, a forming process of diffusion-prevention film 36 is discussed with reference to FIGS. 9E to 9G.

Figure 9E:
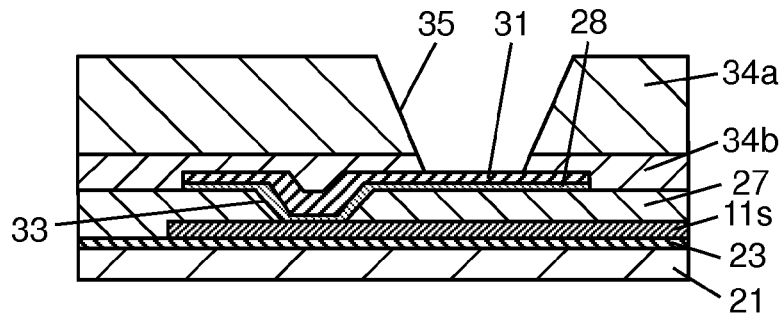
FIG. 9E is a sectional view illustrating a manufacturing process of the portion corresponding to the area A of FIG. 6.

First, using a patterned contact hole 35 as a mask, interlayer insulation film 34b is fabricated by dry etching such that the contact hole 35 penetrates the film 34b, as illustrated in FIG. 9E.

Figure 9F:
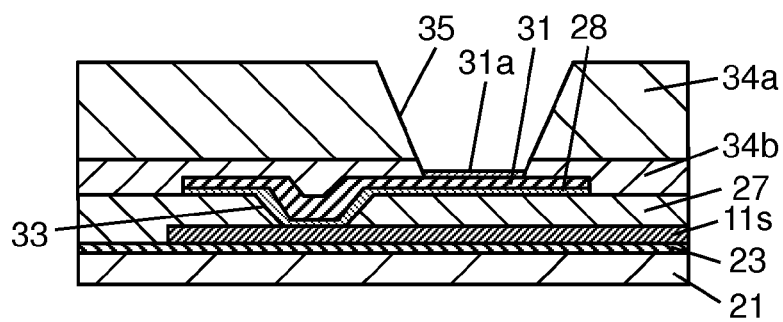
FIG. 9F is a sectional view illustrating a manufacturing process of the portion corresponding to the area A of FIG. 6.

Next, as illustrated in FIG. 9F, a copper-based oxide film 31a is formed on relay electrode 31 which is in e contact hole 35. As illustrated in FIG. 9G, contact hole 35 is filled with a material same as that of anode 2. Anode 2 and relay electrode 31 are connected electrically via this contact hole 35. Anode 2 can be made of conductive metal, such as Mo, Al, Ag, Au, and Cu, or alloy thereof. Anode 2 can be also made of an organic conductivity material, such as PEDOT/PSS or of zinc oxide, zinc-added indium oxide. Among them, Al-based metal is preferable for anode 2 because the reflectivity is high and cost is low. An electrode pattern is formed by forming a layer using vacuum evaporation method, electron beam evaporation method, RF sputtering method, or printing method.

As a result of the above process, Cu-based oxide film 31a and Al-based anode 2 is connected. However, Al-based diffusion-prevention film 36 is formed because Al has tendency to become ion compared to Cu. A baking process can be added to accelerate an oxidation-reduction reaction.

Figure 9G:
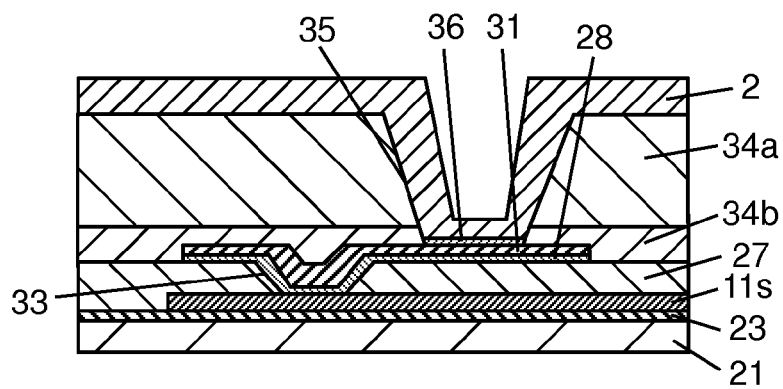
FIG. 9G is a sectional view illustrating a manufacturing process of the portion corresponding to the area A of FIG. 6.

Among the above-mentioned manufacturing process, the process of FIGS. 9E to 9G can be done by self-alignment using interlayer insulation film 34a as a mask. Accordingly, the influence of chemical solution during the photo-resist removal can thereby be avoided, and the use of mask is eliminated, which simplifies manufacturing process and reduces manufacturing cost.

Subsequent to the formation of anode 2 illustrated in FIG. 9G, the EL display is manufactured by layering bank 5a, EL layer 3, and the transparent cathode 4 on TFT array unit 1 in sequence.

Specifically, banks 5a are formed first on interlayer insulation film 34 in positions corresponding to boundaries of each pixels 5. EL layer 3 is formed on anode 2 and in opening of bank 5a for every color, i.e. sub pixel column, or for every sub pixel. This EL layer 3 is configured by a layered structure of an electron hole injection layer, an electron hole transportation layer, a luminescence layer, an electron transportation layer, and an electron injection layer. Copper phthalocyanine can be employed as the electron hole injection layer. Naphthyl diamine, i.e. —NPD (Bis[N-(1-Naphthyl)-N-Phenyl] benzidine) can be employed as the electron hole transportation layer. Tris(8-hydroxyquinolinato) aluminum, i.e. Alq3 (tris(8-hydroxyquinoline) aluminum)) can be employed as the luminescence layer. Oxazole derivative can be employed as the electron transportation layer. Alq3 can be employed as the electron injection layer. However, these materials are the examples and other materials can be employed.

Transparent cathode 4 is an electrode having permeableness and is formed continuously on EL layer 3. Transparent cathode 4 can be made of ITO, $SnO_2$, $In_2O_3$, or ZnO. Transparent cathode 4 can be also made of combination of these materials.

In the above embodiment, the number of the TFTs constituting pixel 5 is two; however three TFTs can be employed to compensate the dispersion between the TFTs of pixel 5. In this case, the similar structure can be employed. In the above embodiment, pixel structure for driving an organic EL device is discussed; however, the present disclosure can be applied to TFT arrays used for LCD displays or inorganic EL displays.

As described above, the EL display of this embodiment has a luminescence unit having a luminescence layer disposed between a pair of electrodes and TFT array unit 1 that controls the light emission of the luminescence unit. An interlayer insulation film is disposed between the luminescence unit and a TFT array unit 1. One of the electrodes of the luminescence unit is connected electrically with TFT array unit 1 via contact hole of the interlayer insulation film. TFT array unit 1 has a current-supplying-electrode that is connected electrically to the electrode of the luminescence unit via the contact hole of the interlayer insulation film. Diffusion-prevention film 36 is formed at the interface of the electrode of the luminescence part and the current supplying electrode of TFT array unit 1.

The foregoing structure allows sufficient contact characteristics, and can avoid disconnection due to counter diffusion.

INDUSTRIAL APPLICABILITY

The present disclosure is useful for improving characteristic of TFT array unit used for EL display.

The invention claimed is:

1. An EL display comprising:
 a luminescence unit having a luminescence layer disposed between a pair of electrodes;
 a thin film transistor array unit controlling luminescence of the luminescence unit;
 an interlayer insulation film disposed between the luminescence unit and the transistor array unit; and
 a current supplying electrode connected electrically to an electrode of the luminescence unit and for connecting the electrode of the luminescence unit to the thin film transistor array unit via a contact hole of the interlayer insulation film,
 wherein a diffusion prevention film is formed on a boundary face between the electrode of the luminescence unit and the current supplying electrode, and the diffusion prevention film is made of an oxide having a main component same as material constituting the electrode of the luminescence unit, and
 the diffusion prevention film has a material composition of $Al_xCu_yO_z$ where $x>y\geq 0$, and $z>0$.

2. The EL display of claim 1, wherein the diffusion prevention film has a film thickness t, where $0<t\leq 6$ nano-meters.

3. A thin film transistor array unit having an interlayer insulation film disposed between a luminescence unit and a current supplying electrode connected electrically to an electrode of the luminescence unit via a contact hole of the interlayer insulation film,
 wherein a diffusion prevention film is formed on a boundary face between the electrode of the luminescence unit and the current supplying electrode, and the diffusion prevention film is made of an oxide having a main component same as material constituting the electrode of the luminescence unit, and
 the diffusion prevention film has a material composition of $Al_xCu_yO_z$ where $x>y\geq 0$, and $z>0$.

4. The thin film transistor array unit of claim 3, wherein the diffusion prevention film has a film thickness t, where $0<t\leq 6$ nano-meters.

* * * * *